(12) United States Patent
Sato et al.

(10) Patent No.: US 7,965,474 B2
(45) Date of Patent: Jun. 21, 2011

(54) MAGNETIC OSCILLATION ELEMENT

(75) Inventors: Rie Sato, Yokohama (JP); Koichi Mizushima, Kamakura (JP); Kiwamu Kudo, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 939 days.

(21) Appl. No.: 11/859,906

(22) Filed: Sep. 24, 2007

(65) Prior Publication Data

US 2008/0074806 A1 Mar. 27, 2008

(30) Foreign Application Priority Data

Sep. 25, 2006 (JP) ................................ P2006-259506

(51) Int. Cl.
*G11B 5/33* (2006.01)
(52) U.S. Cl. .................................................. 360/324.12
(58) Field of Classification Search ........................ None
See application file for complete search history.

(56) References Cited

U.S. PATENT DOCUMENTS

| | | | | |
|---|---|---|---|---|
| 7,471,491 B2 * | 12/2008 | Sato et al. | | 360/313 |
| 7,602,588 B2 * | 10/2009 | Sato et al. | | 360/324 |
| 7,616,412 B2 * | 11/2009 | Zhu et al. | | 360/324.2 |
| 7,633,699 B2 * | 12/2009 | Kaka et al. | | 360/67 |
| 7,667,933 B2 * | 2/2010 | Kudo et al. | | 360/313 |
| 2006/0039089 A1 * | 2/2006 | Sato | | 360/324 |
| 2006/0221507 A1 * | 10/2006 | Sato et al. | | 360/324 |
| 2008/0019040 A1 * | 1/2008 | Zhu et al. | | 360/110 |

OTHER PUBLICATIONS

R. Sato, et al., "Resonating magnetoresistance induced by the injection of spin fluctuation", Journal of Magnetism and Magnetic Materials, vol. 279, 2004, pp. 36-40 submitting statement of relevancy only, reference previously filed on Sep. 24, 2007.
I.N. Krivorotov, et al., "Time-Domain Measurements of Nanomagnet Dynamics Driven by Spin-Transfer Torques", Science, vol. 307, Jan. 14, 2005, pp. 228-231.
R. Sato, et al., "Resonating magnetoresistance induced by the injectionof spin fluctuation", Journal of Magnetism and Magnetic Materials, vol. 279, 2004, pp. 36-40.

* cited by examiner

*Primary Examiner* — Mark Blouin
(74) *Attorney, Agent, or Firm* — Oblon, Spivak, McClelland, Maier & Neustadt, L.L.P.

(57) ABSTRACT

A magnetic oscillation element includes a magnetization fixing layer whose magnetization direction is substantially pinned toward one direction, a nonmagnetic layer that is disposed on the magnetization fixing layer, and a magnetization free layer whose magnetization direction fluctuates. The magnetization free layer is disposed on the nonmagnetic layer. A pair of electrodes apply a current in a direction perpendicular to the film surface of the magnetization fixing layer, the nonmagnetic layer, and the magnetization free layer. The magnetization free layer is excited with a magnetization vibration caused by spin transfer from the magnetization fixing layer due to the appliance of the current.

20 Claims, 14 Drawing Sheets

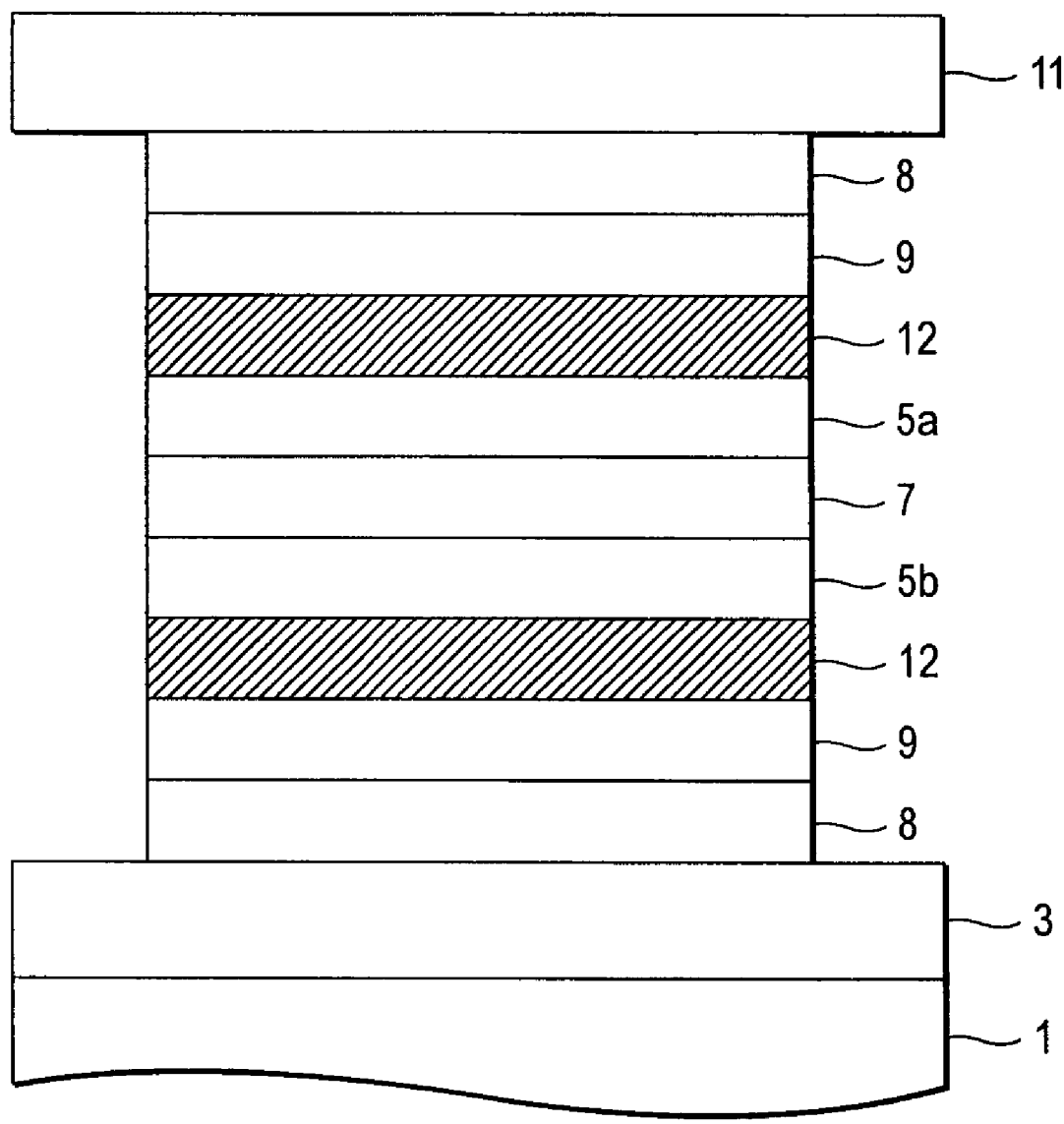

MAGNETIC OSCILLATION ELEMENT

RELATED APPLICATION(S)

The present disclosure relates to the subject matter contained in Japanese Patent Application No. 2006-259506 filed on Sep. 25, 2006, which is incorporated herein by reference in its entirety.

FIELD

The present invention relates to a minute magnetic oscillation element applied to: a magnetoresistive head for reading out a magnetically recorded data in high-density magnetic recording; and an element having new function for wireless signal transmission and communications installed in a highly integrated LSI.

BACKGROUND

The recording density in magnetic recording is improving at an annual rate of 100% since an advent of a GMR head using the giant magneto-resistance effect (GMR effect). A GMR element includes stacked films having a sandwiched structure of ferromagnetic layer/nonmagnetic layer/ferromagnetic layer. The GMR element is an element using the magneto-resistance effect of a spin valve film for applying an exchange bias to one ferromagnetic layer for fixing magnetization thereof and changing the magnetization direction of the other ferromagnetic layer by an external magnetic field for detecting change in the relative angle of the magnetization directions of the two ferromagnetic layers as change in the resistance value. A CIP (Current In Plane)-GMR element for allowing an electric current to flow into the film surface of a spin valve film and detecting resistance change and a CPP (Current Perpendicular to Plane)-GMR element for allowing an electric current to flow perpendicularly to the film surface of a spin valve film and detecting resistance change are developed. The magnetic resistance ratio (MR ratio) of each of the CIP-GMR element and the CPP-GMR element is about several percent, and it is considered that the elements will be able to cover the recording density of up to about 200 gigabits/$inch^2$.

To cover higher-density magnetic recording, development of a TMR element using the tunneling magneto-resistance effect (TMR effect) is pursued. The TMR element includes stacked films of tunnel insulating layer made up of ferromagnetic layer/insulator/ferromagnetic layer, and a voltage is applied to the nip between the ferromagnetic layers for allowing a tunnel current to flow. The TMR element is an element for using the fact that the magnitude of the tunnel current changes depending on the direction of magnetization of the top and bottom ferromagnetic layers and detecting change in the relative angle of magnetization as change in the tunnel resistance value. The TMR element has maximum MR ratio of about 50%. Since the TMR element has a larger MR ratio than the GMR element, the signal voltage also becomes large.

However, in the TMR element, not only the pure signal component, but also the noise component of shot noise becomes large. Accordingly, the S/N ratio (signal-to-noise ratio) needs to be improved in the TMR element. The shot noise is caused by fluctuations of current occurring as electrons irregularly pass through a tunnel barrier, and increases in proportion to the square root of the tunnel resistance value. Therefore, in order to suppress the shot noise and obtain a necessary signal voltage, the tunnel insulating layer needs to be thinned for lessening the tunnel resistance.

As the recording density becomes higher, it becomes more necessary to lessen the element size to a size of the same degree as a record bit. Thus, the density becomes higher, it becomes more necessary to lessen the joint resistance of the tunnel insulating layer, namely, thin the insulating layer. At the recording density of 300 gigabits/$inch^2$, joint resistance of 1Ω·$cm^2$ or less is required and a tunnel insulating layer having a thickness of two layers of atoms in terms of the film thickness of an Al—O (aluminum oxide film) tunnel insulating layer must be formed. As the tunnel insulating layer is made thinner, a short circuit between upper and lower electrodes occurs more easily and degradation of the MR ratio is incurred and therefore it becomes dramatically difficult to manufacture elements. Thus, it is assumed that the limit of the recording density of the TMR element may be 300 gigabits/$inch^2$.

Each of the elements described above uses the magneto-resistance effect in a wide sense; a problem of magnetic white noise common to the elements has sprung up in recent years. Unlike electric noise such as shot noise described above, the magnetic white noise is caused by thermal fluctuations of magnetization and thus becomes more dominant with miniaturization of the elements. Therefore, it is considered that an element covering a higher density will outstrip the electric noise. In order to avoid the magnetic white noise and further increase the recording density of magnetic recording, a minute magnetic sensor operating according to a principle different from the former magneto-resistance effect becomes necessary and development of a magnetic oscillation element as such a magnetic sensor is pursued.

In the highly integrated LSI field, metal wiring of Al, Cu, etc., is used at present; a problem of a signal delay caused by resistance or inductance with an increase in the wiring length becomes obvious. To solve the signal delay problem and realize an LSI that can operate at higher speed, development of a wireless LSI for transferring signals using minute magnetic oscillation elements and minute magnetic reception elements without using wiring is also pursued.

Further, development of a communication device such as a spin-torque diode using the singular nature of the magnetic oscillation element is also started.

An example of such device is described in the following document:

R. Sato, et al. J. Magn. Magn. Mat. vol. 279, p. 36 (2004)

It is expected that the magnetic oscillation element will be applied to various fields including magnetic recording as described above; however, the magnetic oscillation element has disadvantages in that thermal noise accompanying thermal fluctuations of magnetization is large and the signal purity is low because the magnetic oscillation element is a nano-scale minute element.

SUMMARY

According to a first aspect of the invention, there is provided a magnetic oscillation element including: a magnetization fixing layer whose magnetization direction is substantially pinned toward one direction; a nonmagnetic layer that is disposed on the magnetization fixing layer; a magnetization free layer whose magnetization direction fluctuates, the magnetization free layer being disposed on the nonmagnetic layer; and a pair of electrodes that applies a current in a direction perpendicular to the film surface of the magnetization fixing layer, the nonmagnetic layer, and the magnetization free layer, wherein the magnetization free layer is excited with a magnetization oscillation caused by spin transfer from the magnetization fixing layer due to the appliance of the current.

According to a second aspect of the invention, there is provided a magnetic oscillation element including: a multilayer film including: a first magnetization fixing layer whose magnetization direction is substantially pinned toward one direction; a first nonmagnetic layer that is disposed on the first magnetization fixing layer; a first magnetization free layer whose magnetization direction fluctuates, the first magnetization free layer being disposed on the first nonmagnetic layer; a second nonmagnetic layer that is disposed on the first magnetization free layer; a second magnetization free layer whose magnetization direction fluctuates, the second magnetization free layer being disposed on the second nonmagnetic layer; a third nonmagnetic layer that is disposed on the second magnetization free layer; and a second magnetization fixing layer whose magnetization direction is pinned toward one direction, the second magnetization fixing layer being disposed on the third nonmagnetic layer; and a pair of electrodes that applies a current in a direction perpendicular to the film surface of the multilayer film, wherein the first and second magnetization free layers are excited with a magnetization oscillation caused by spin transfer from the first and second magnetization fixing layers due to the appliance of the current.

According to a third aspect of the invention, there is provided a magnetic sensor including the magnetic oscillation element according to the first and second aspects.

According to a fourth aspect of the invention, there is provided a magnetoresistive head including the magnetic sensor according to the third aspect.

According to a fifth aspect of the invention, there is provided a magnetic recording/reproducing apparatus including: the magnetoresistive head according to the fourth aspect; and a magnetic recording medium.

BRIEF DESCRIPTION OF THE DRAWINGS

In the accompanying drawings:

FIG. 11 is a sectional view to show a magnetic oscillation element according to a modified example of the embodiments of the invention;

DETAILED DESCRIPTION OF THE EMBODIMENTS

Figure 1:
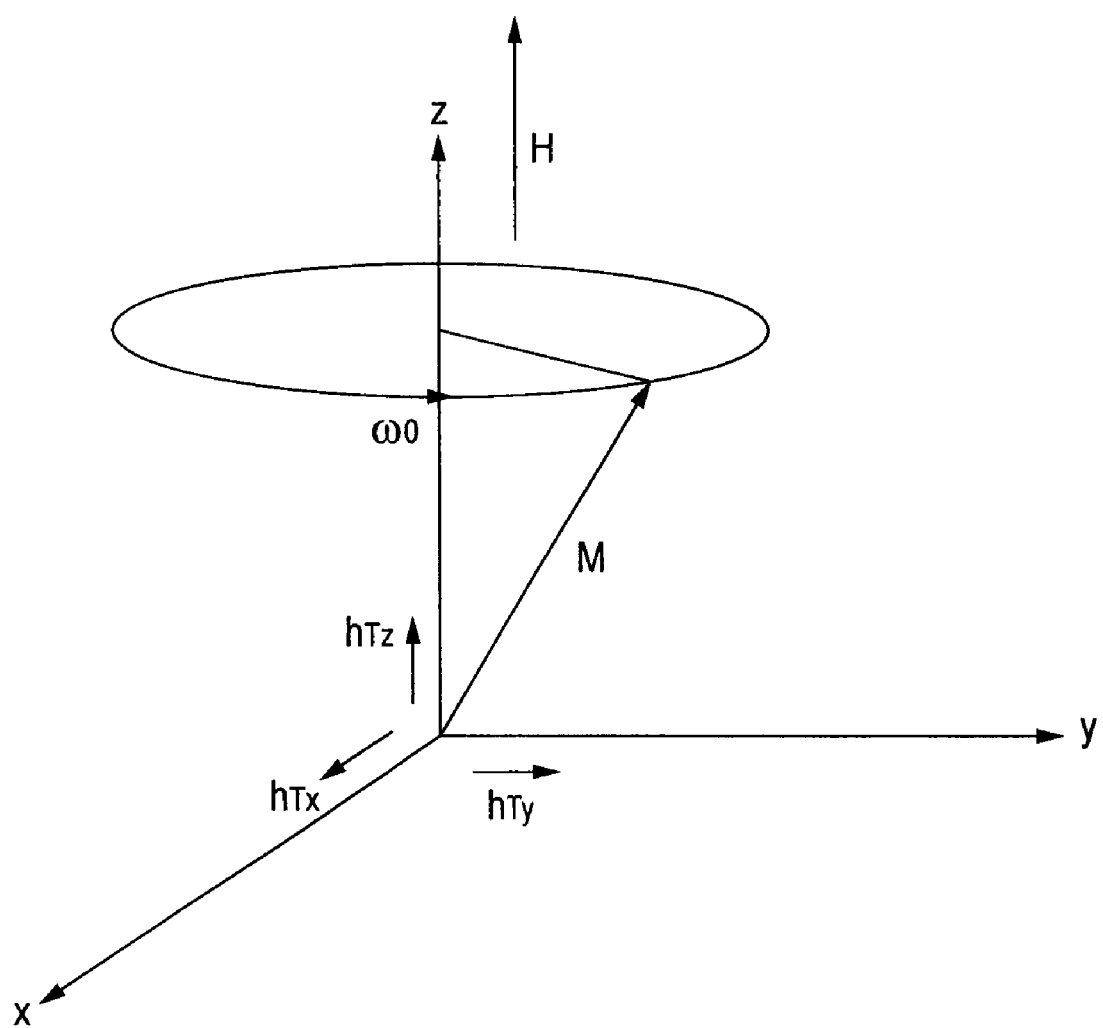
FIG. 1 is a drawing to show magnetization motion in an oscillation state.

Embodiments of the invention will be discussed in detail with reference to the accompanying drawings. In the following description, identical parts are denoted by the same reference numerals and will not be discussed again.

To begin with, before the description of the embodiments of the invention, the occurrence cause of noise of a magnetic oscillation element will be discussed.

The main noise of the magnetic oscillation element is noise occurring in the proximity of an oscillatory frequency and the magnitude of the noise depends on the element structure and material. The noise in the proximity of the oscillatory frequency generally can be represented as the width of an oscillation spectrum (or oscillation line width) or a CN ratio (carrier-to-noise ratio). That is, to decrease the noise of the magnetic oscillation element, it is important to narrow the oscillation line width caused by thermal fluctuation magnetic field $h_{Ti}$ (i=x, y, z). The thermal fluctuation magnetic field is a random magnetic field caused by lattice vibration of a magnetic substance and a statistical root mean square thereof is represented by the following Expression (1) where α, M, and V are an attenuation constant, saturation magnetization, and the volume of a magnetization free layer respectively, k, T, and y are Boltzmann's constant, temperature, and gyromagnetic ratio respectively, and B is band width.

$$\langle h_{Ti}^2 \rangle = \frac{4\alpha kT}{\gamma MV} B, \qquad (1)$$
$$i = x, y, z$$

FIG. 1 shows motion of magnetization free layer magnetization in the oscillation state of an oscillatory frequency $\omega_0$ under a static magnetic field H. Such a precession spectrum becomes a spectrum with a narrow line width if the thermal fluctuation magnetic field $h_{Ti}$ is small, but the line width increases as $h_{Ti}$ increases. There are two causes for the line width increase caused by $h_{Ti}$. The first cause is involvement of thermal fluctuation magnetic fields $h_{Tx}$ and $h_{Ty}$ in a perpendicular direction to the static magnetic field H in FIG. 1; as they increase, the spectrum line width of Lorentz function type increases. The second cause is the spectrum line width of Gaussian function type accompanying the magnetic field dependency of an oscillatory frequency $f_0$, and the thermal fluctuation magnetic field $h_{Tz}$ in the direction of the static magnetic field is involved. It is known that line width Δf based on the first cause is represented approximately by the following Expression (2).

$$\Delta f = 2\gamma \frac{\alpha kT}{MV} \frac{1}{\langle m_x^2 \rangle} \quad (2)$$

However, $m_x = M_x/M$, $M_x$ is an X component of magnetization. The line width is inversely proportional to mean square of oscillatory amplitude $\langle m_x^2 \rangle$ like phase noise of an electronic oscillator. Thus, as it excites more strongly, the line width decreases. As is obvious from Expression (2), when the saturation magnetization M and the volume V of the magnetization free layer are the same, if a material with small attenuation constant α is used, the width becomes narrower. On the other hand, line width $\Delta f_z$ based on the second cause is represented as in Expression (3) and as the magnetic field dependency of oscillatory frequency, $df_0/dH$, is larger, the line width becomes wider.

$$\Delta f_z = \frac{df_0}{dH}\sqrt{\langle h_{Tz}^2 \rangle} = \frac{df_0}{dH}\sqrt{\frac{4\alpha kT}{\gamma MV}B} \quad (3)$$

Figure 2:
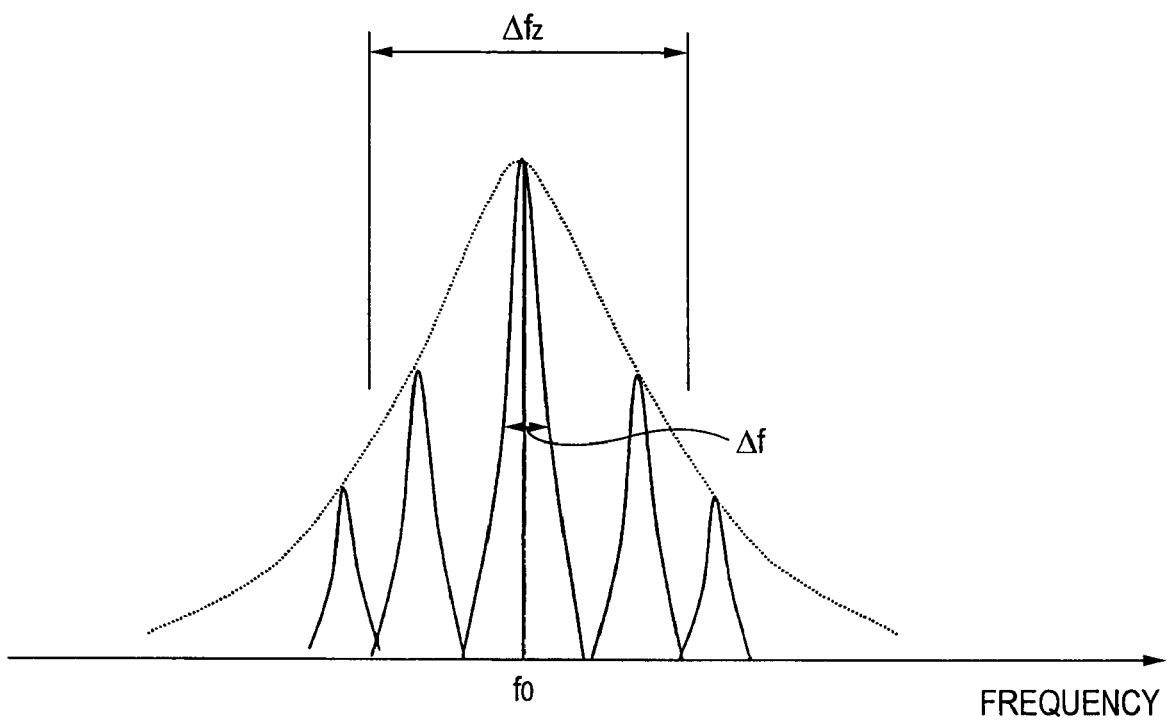
FIG. 2 is a drawing to show the oscillation line width based on thermal vibration magnetic field in x, y direction and the oscillation line width based on thermal vibration magnetic field in z direction.

The upper limit of the band width B of a thermal vibration magnetic field produced by lattice vibration is about 10 THz; in fact, B is determined by the frequency that can be followed by the magnetic moment of the magnetization free layer in uison and it is about 100 GHz. For an oscillation element whose element size is 100 nm or less, usually $\Delta f$ is one-tenth of $\Delta f_z$ or less in the state in which the element is excited strongly at a room temperature (as in Expression (4)) and thus the whole oscillation line width, namely, the signal purity is determined by $\Delta f_z$ in Expression (3) as shown in FIG. 2.

$$\sqrt{\langle m_x^2 \rangle} \geq 0.1 \quad (4)$$

Therefore, the oscillation line width can be narrowed by using a magnetization free layer with small magnetic field dependency of oscillatory frequency.

First Embodiment

Figure 3:
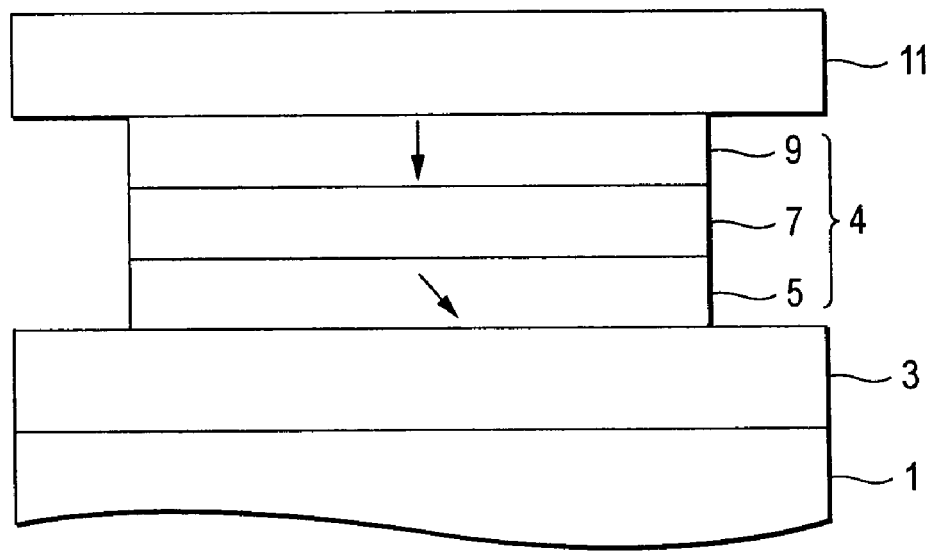
FIG. 3 is a sectional view to show a magnetic oscillation element according to a first embodiment of the invention.

FIG. 3 is a sectional view of a magnetic oscillation element according to a first embodiment of the invention. The magnetic oscillation element according to the first embodiment includes a lower electrode 3 provided on a substrate 1 and also serving as a magnetic shield, a magnetization free layer 5 provided on the lower electrode 3 with the magnetization direction being substantially perpendicular to the film surface, a non-magnetic layer 7 provided on the magnetization free layer 5, a magnetization fixing layer 9 provided on the non-magnetic layer 7 with the magnetization direction being substantially perpendicular to the film surface, and an upper electrode 11 provided on the magnetization fixing layer 9 and also serving as a magnetic shield. The magnetization free layer 5, the non-magnetic layer 7, and the magnetization fixing layer 9 form a stacked film 4 with the same flat surface shape. The magnetization direction of each of the magnetization free layer 5 and the magnetization fixing layer 9 is substantially perpendicular to the film surface, namely, the easy axis of magnetization is substantially perpendicular to the film surface. In the first embodiment, the expression "substantially perpendicular" may contain inclination of ±15 degrees from the completely perpendicular state.

Since the magnetization free layer of a magnetic oscillation element in the related art uses an in-plane magnetization film with a large demagnetization effect, the oscillatory frequency shows strong magnetic field dependency and $\Delta f_z$ increases, as shown in the following Expression (5) where $H_k$ is the sum of in-plane anisotropic magnetic field and external magnetic field.

$$\frac{df_0}{dH} = \frac{\gamma}{2}\sqrt{\frac{4\pi M}{H_k}} \quad (5)$$

In the first embodiment, a perpendicular magnetization film is used as the magnetization free layer 5, whereby the magnetic field dependency of the perpendicular magnetization film is indicated by Expression (6). Since the magnetic field dependency decreases to about one-fifth of the magnetic field dependency of the in-plane magnetization film, the signal purity becomes almost five times that of the in-plane magnetization film.

$$\frac{df_0}{dH} = \gamma \quad (6)$$

Co, a CoCr-based alloy such as CoCrTa, CoCrTaPt, or CoTaNb, a Co multilayer film of Co/Pd, Co/Pt, Co—Cr—Ta/Pd, etc., a CoCrPt-based alloy, a FePt-based alloy, and further an SmCo-based alloy, a TbFeCo alloy, etc., containing rare-earth elements are suited as a magnetization free layer material showing perpendicular magnetic anisotropy.

Second Embodiment

Figure 4:
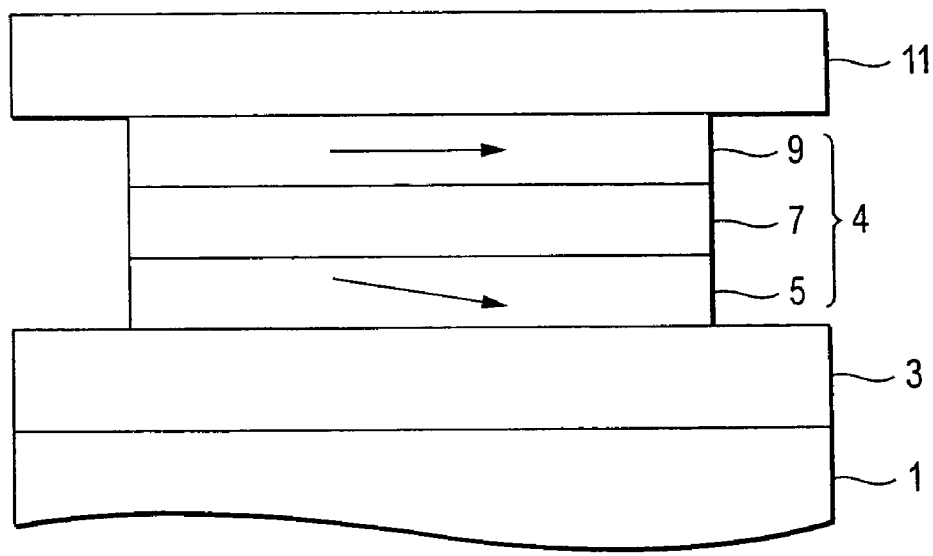
FIG. 4 is a sectional view to show a magnetic oscillation element according to a second embodiment of the invention.

FIG. 4 is a sectional view of a magnetic oscillation element according to a second embodiment of the invention.

The magnetic oscillation element according to the second embodiment includes a lower electrode 3 provided on a substrate 1 and also serving as a magnetic shield, a magnetization free layer 5 provided on the lower electrode 3 with the magnetization direction being substantially horizontal to the film surface, a non-magnetic layer 7 provided on the magnetization free layer 5, a magnetization fixing layer 9 provided on the non-magnetic layer 7 with the magnetization direction being substantially horizontal to the film surface, and an upper electrode 11 provided on the magnetization fixing layer 9 and also serving as a magnetic shield. The magnetization free layer 5, the non-magnetic layer 7, and the magnetization fixing layer 9 form a stacked film 4 with the same flat surface shape. The magnetization direction of each of the magnetization free layer 5 and the magnetization fixing layer 9 is substantially horizontal to the film surface, namely, the easy axis of magnetization is substantially horizontal to the film surface. In the embodiment, the expression "substantially horizontal" contains inclination of +15 degrees from the completely horizontal state.

In the second embodiment, an in-plane magnetization film having crystal anisotropy, of a proper size such as a Co film having a proper film thickness is used as the magnetization free layer 5. In such an in-plane magnetization film, the magnitude of a demagnetizing field $H_d$ is represented by Expression (7) as the difference between shape anisotropy magnetic field 4 nM and crystal anisotropy magnetic field Hk1 and thus a magnetization free layer material and its film thickness are appropriately selected, whereby $H_d$ can be decreased and the magnetic field dependency of oscillatory frequency can be decreased.

$$H_d = 4\pi M - H_{k1} \quad (7)$$

If $H_d$ is decreased to several 100 Oe, the magnetic field dependency of oscillatory frequency is given approximately by Expression (5).

Third Embodiment

Figure 5:
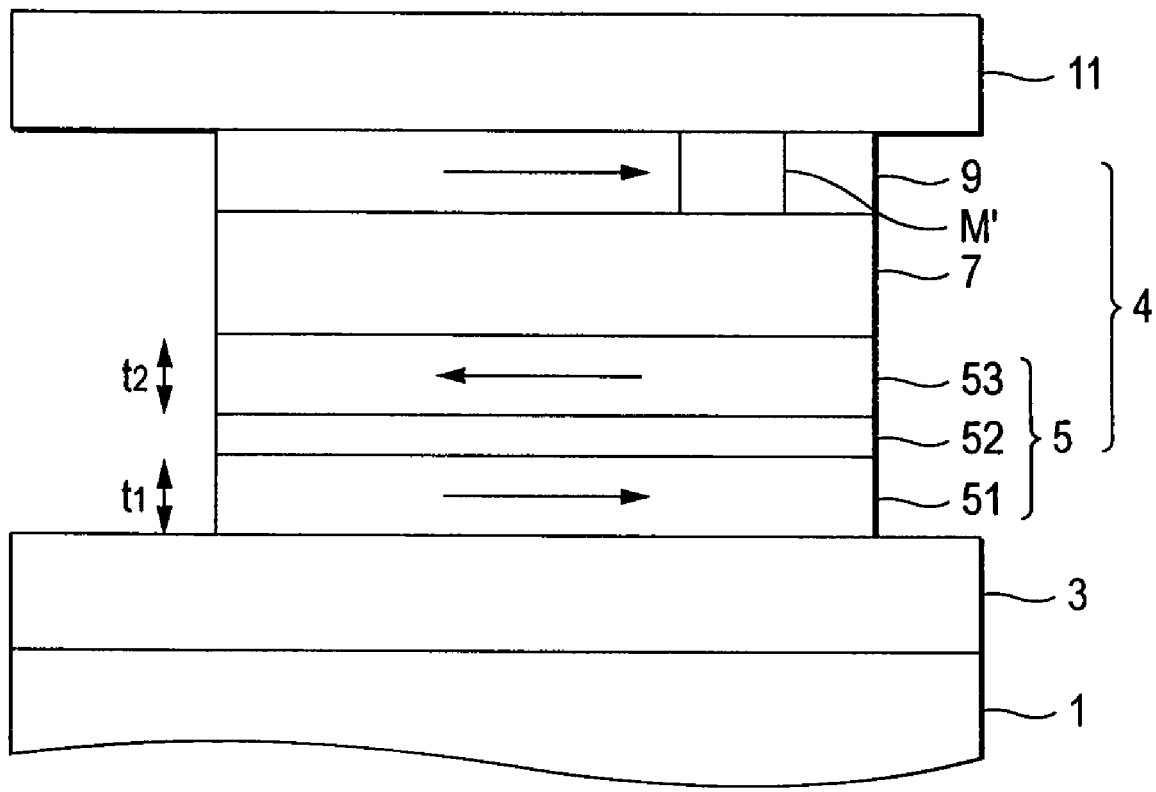
FIG. 5 is a sectional view to show a magnetic oscillation element according to a third embodiment of the invention.

FIG. 5 is a sectional view of a magnetic oscillation element according to a third embodiment of the invention. The magnetic oscillation element according to the embodiment includes a lower electrode 3 provided on a substrate 1 and also serving as a magnetic shield, a magnetization free layer 5 provided on the lower electrode 3 with the magnetization direction being substantially parallel to the film surface, a non-magnetic layer 7 provided on the magnetization free layer 5, a magnetization fixing layer 9 provided on the non-magnetic layer 7 with the magnetization direction being substantially parallel to the film surface, and an upper electrode 11 provided on the magnetization fixing layer 9 and also serving as a magnetic shield. The magnetization free layer 5, the non-magnetic layer 7, and the magnetization fixing layer 9 form a stacked film 4 with the same flat surface shape. The magnetization direction of each of the magnetization free layer 5 and the magnetization fixing layer 9 is substantially perpendicular to the film surface, namely, the easy axis of magnetization is substantially parallel to the film surface. In the embodiment, the expression "substantially parallel" contains inclination of ±15 degrees from the completely parallel state.

In the third embodiment, an artificial ferrimagnetic substance is used as the magnetization free layer 5. The artificial ferrimagnetic substance is a stacked film like ferromagnetic layer 51/nonmagnetic layer 52/ferromagnetic layer 53 as shown in FIG. 5. Since the effective saturation magnetization in such an artificial ferrimagnetic substance is given by Expression (8), the difference between thicknesses $t_1$ and $t_2$ is lessened, whereby effective saturation magnetization $M_{ferri}$ can be decreased and the demagnetizing field can be decreased.

$$M_{ferri} = M \frac{t_1 - t_2}{t_1 + t_2} \quad (8)$$

Figure 6A:
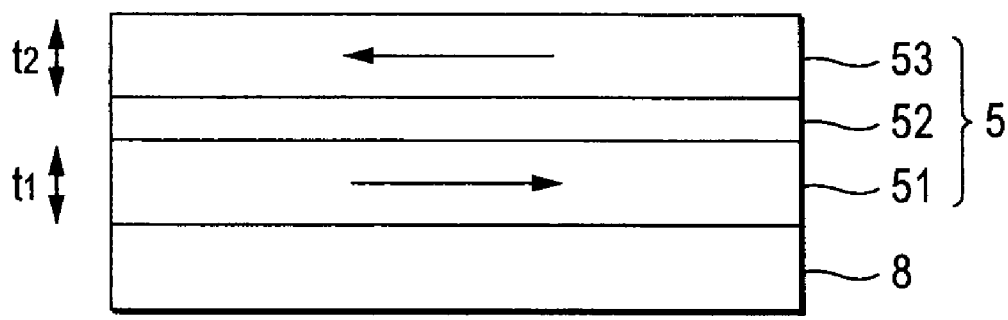
FIGS. 6A and 6B are drawings to show exchange bias to a magnetization free layer made of an artificial ferrimagnetic substance.
Figure 6B:
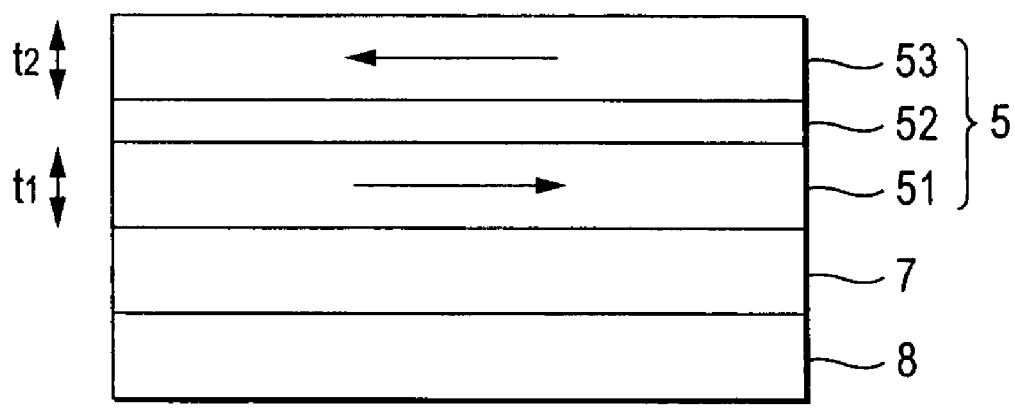

The magnetic field dependency of oscillatory frequency in the artificial ferrimagnetic substance is also given approximately by Expression (6). To use the artificial ferrimagnetic substance as the magnetization free layer, it is also effective to cause an exchange bias to act on the magnetization free layer directly or through the non-magnetic layer 7 using an antiferromagnetic layer 8 as shown in FIG. 6A or 6B. Since an extremely large exchange bias can be caused to act on the artificial ferrimagnetic substance, the oscillatory frequency can be raised to about 100 GHz and the Q value of oscillation given in Expression (9) can be increased.

$$Q = f_0 / \Delta f_z \quad (9)$$

Fourth Embodiment

Figure 7:
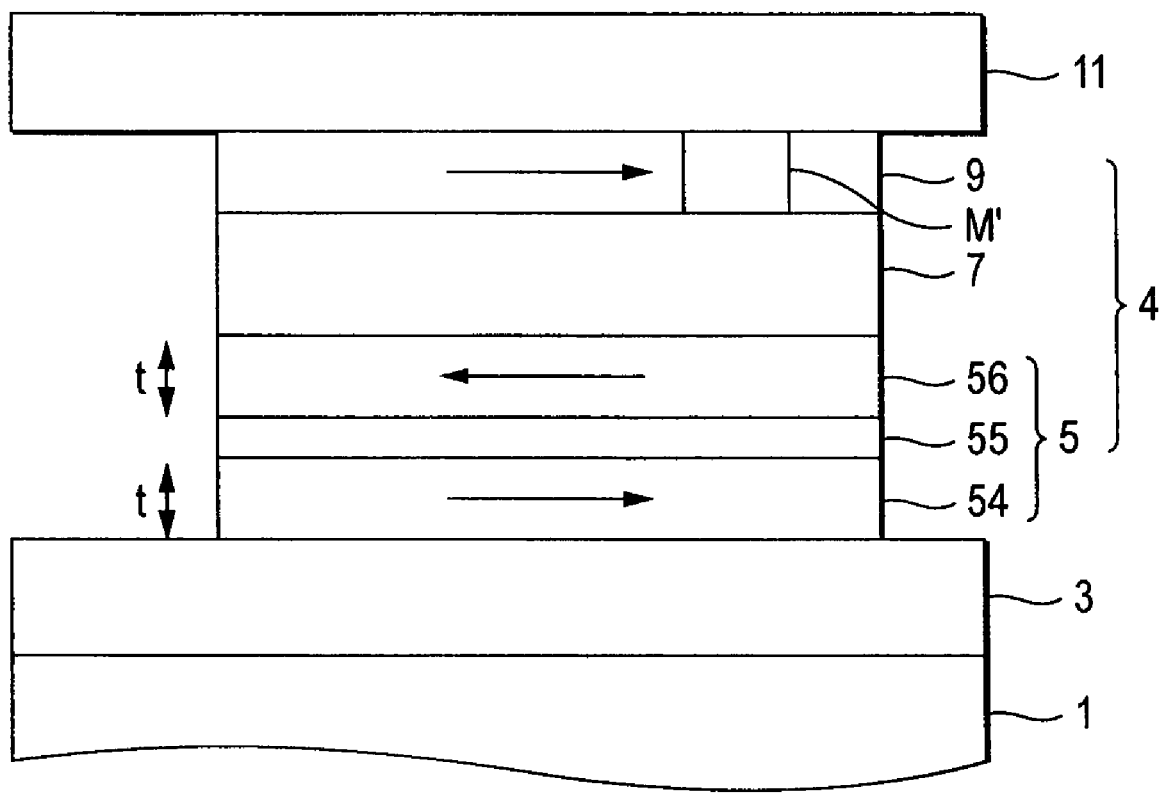
FIG. 7 is a sectional view to show a magnetic oscillation element according to a fourth embodiment of the invention.

FIG. 7 is a sectional view of a magnetic oscillation element according to a fourth embodiment of the invention. The magnetic oscillation element according to the embodiment includes a lower electrode 3 provided on a substrate 1 and also serving as a magnetic shield, a magnetization free layer 5 provided on the lower electrode 3 with the magnetization direction being substantially parallel to the film surface, a non-magnetic layer 7 provided on the magnetization free layer 5, a magnetization fixing layer 9 provided on the non-magnetic layer 7 with the magnetization direction being substantially parallel to the film surface, and an upper electrode 11 provided on the magnetization fixing layer 9 and also serving as a magnetic shield. The magnetization free layer 5, the non-magnetic layer 7, and the magnetization fixing layer 9 form a stacked film 4 with the same flat surface shape. The magnetization direction of each of the magnetization free layer 5 and the magnetization fixing layer 9 is substantially parallel to the film surface, namely, the easy axis of magnetization is substantially parallel to the film surface. In the embodiment, the expression "substantially parallel" contains inclination of ±15 degrees from the completely parallel state.

Figure 8:
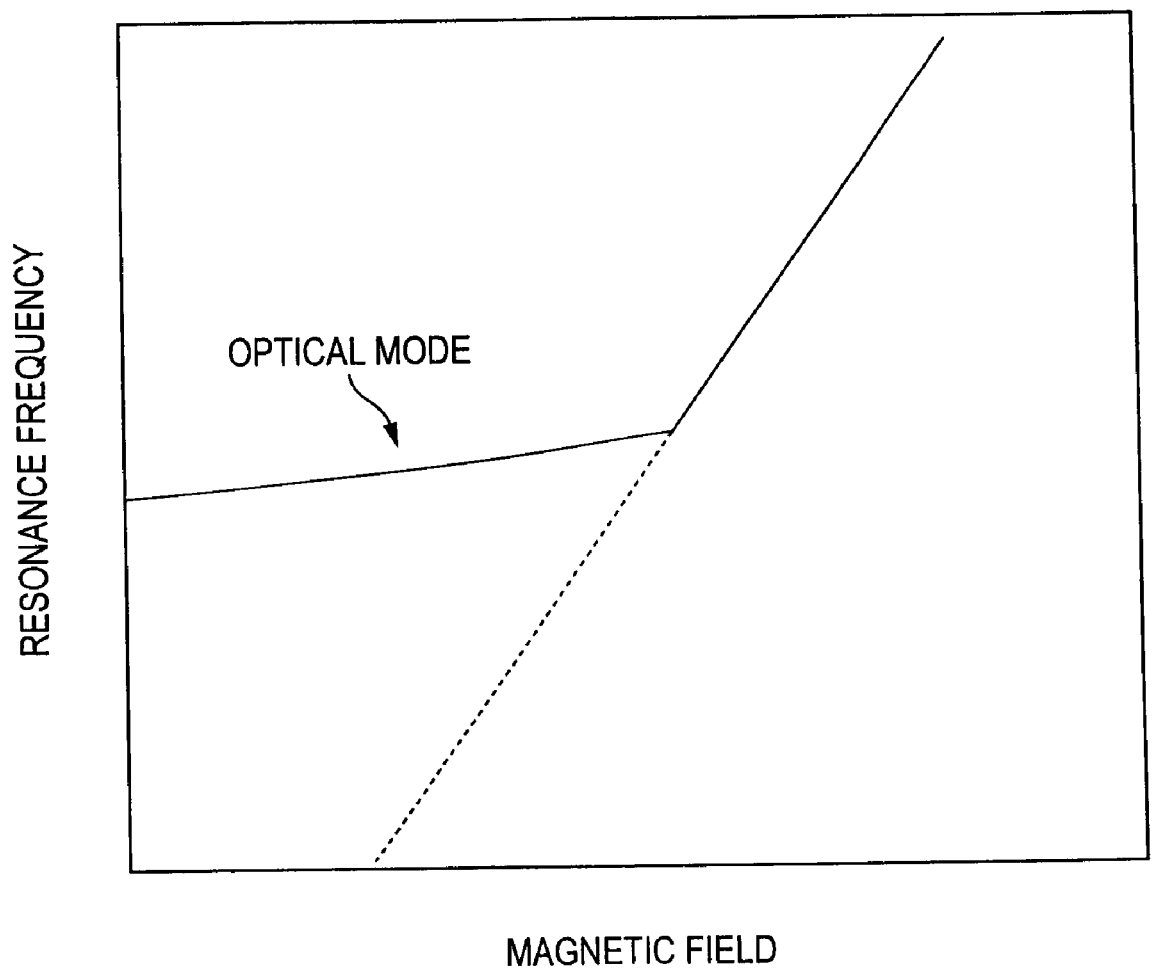
FIG. 8 is a drawing to show an optical mode of an artificial antiferromagnetic substance.

In the fourth embodiment, an artificial antiferromagnetic substance is used as the magnetization free layer 5. The artificial antiferromagnetic substance is a stacked film like ferromagnetic layer 54/nonmagnetic layer 55/ferromagnetic layer 56 as shown in FIG. 7. In an artificial antiferromagnetic substance of Co/Ru/Co, etc., it is known that there is a resonance mode called an optical mode with extremely small magnetic field dependency of a resonance frequency by appropriately controlling the film thicknesses of Co and Ru as shown in FIG. 8. To use such an artificial antiferromagnetic substance, Expression (10) is made possible, so that it is made possible to remarkably decrease the oscillation line width to one-tenth that when a perpendicular magnetization film is used or to about one-fiftieth that when an in-plane magnetization film is used.

$$df_0/dH \approx 0.1\gamma \quad (10)$$

Modified Examples of Embodiments

The magnetization free layer structure described above is predicated on the already existing element structure containing the magnetization fixing layer/nonmagnetic layer/magnetization free layer shown in FIG. 3 as the basic structure, but a similar magnetization free layer structure is also effective for an element containing magnetization fixing layer/insulating layer/magnetization free layer using an insulting layer in place of the nonmagnetic layer as the basic structure.

Figure 9:
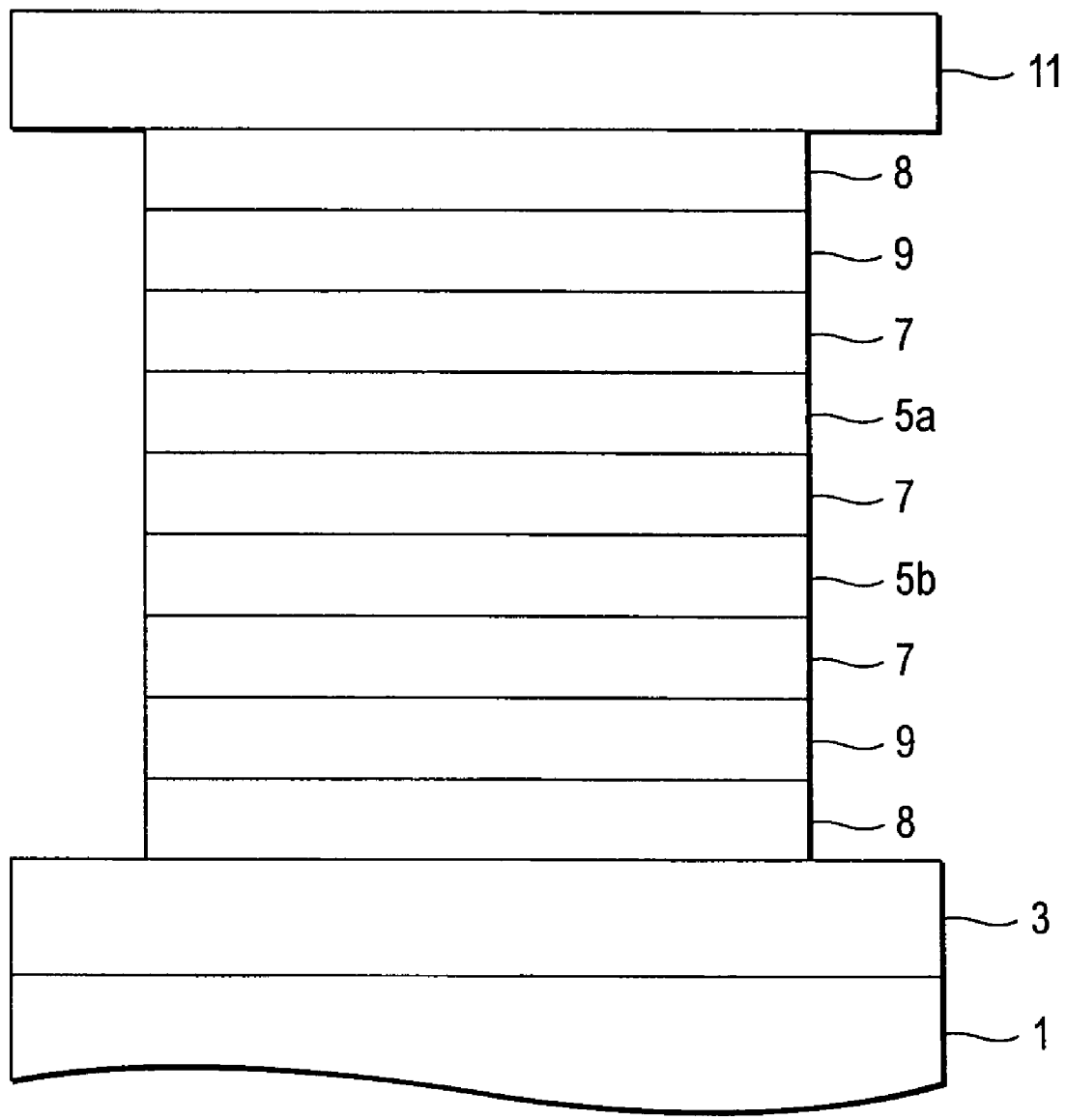
FIG. 9 is a sectional view to show a magnetic oscillation element according to a modified example of the embodiments of the invention.
Figure 10:
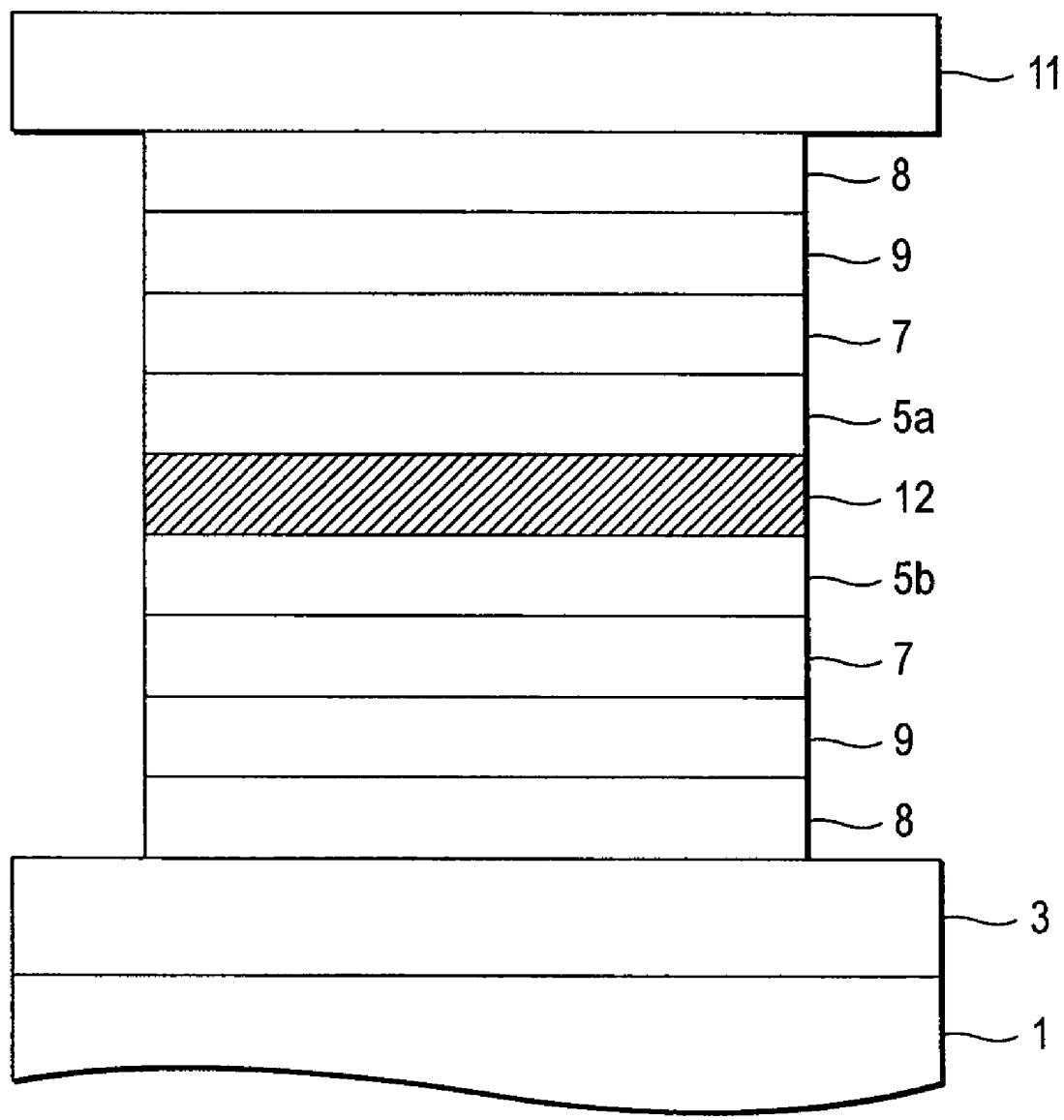
FIG. 10 is a sectional view to show a magnetic oscillation element according to a modified example of the embodiments of the invention.

Further, a similar magnetization free layer structure is also effective in an element in FIG. 9 having a stack structure of magnetization fixing layer 1/nonmagnetic layer/magnetization free layer 1/nonmagnetic layer/magnetization free layer 2/nonmagnetic layer/magnetization fixing layer 2 as the basic structure and elements in FIGS. 10 and 11 with some of the nonmagnetic layers in FIG. 9 replaced with an insulating layer 12 characterized in that the two magnetization free layer are contained. With the elements in FIGS. 9, 10, and 11, the threshold current of oscillation can be lessened as compared with the elements in FIGS. 3 and 4, so that power consumption can be more lessened.

Figure 12A:
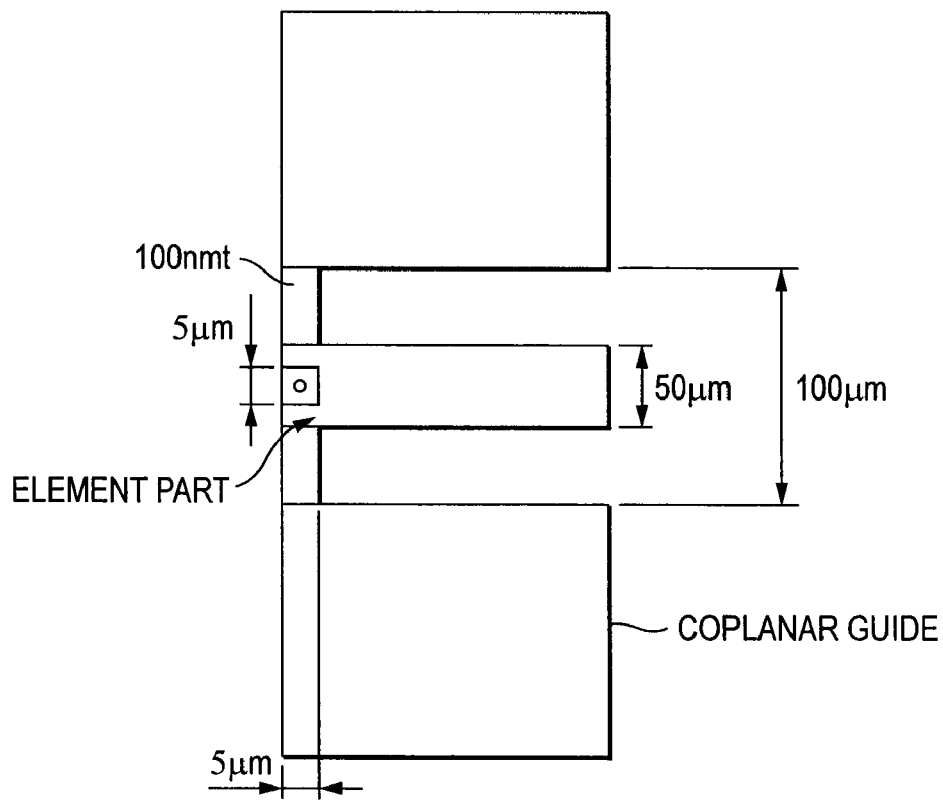
FIGS. 12A and 12B are drawings to show connection of the element of the invention to a coplanar guide.
Figure 12B:
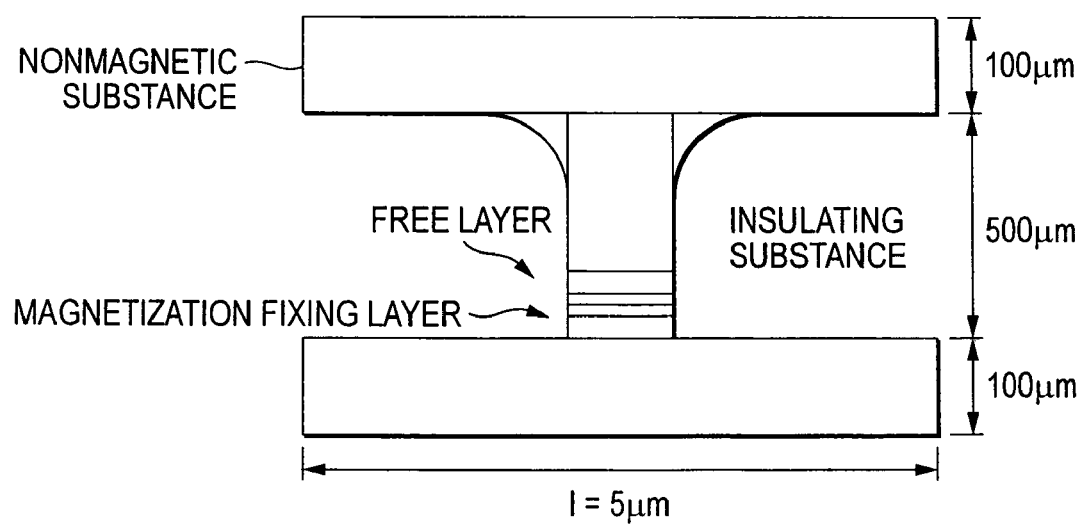

Unlike a usual electric oscillator, the magnetic oscillation element converts motion of magnetization into electric vibration according to the GMR effect and outputs the result as electric power. That is, since negative resistance existing in an electric oscillator does not exist, impedance matching with a transmission line or load becomes extremely important. That is, it is desirable that the element should be connected so as to become equal to the characteristic impedance of the transmission line, but the element can be built directly in the transmission line because it is a minute element. FIGS. 12A and 12B show an example of a magnetic oscillation element built in a coplanar guide.

Next, examples according to the invention will be discussed.

First Example

Figure 13:
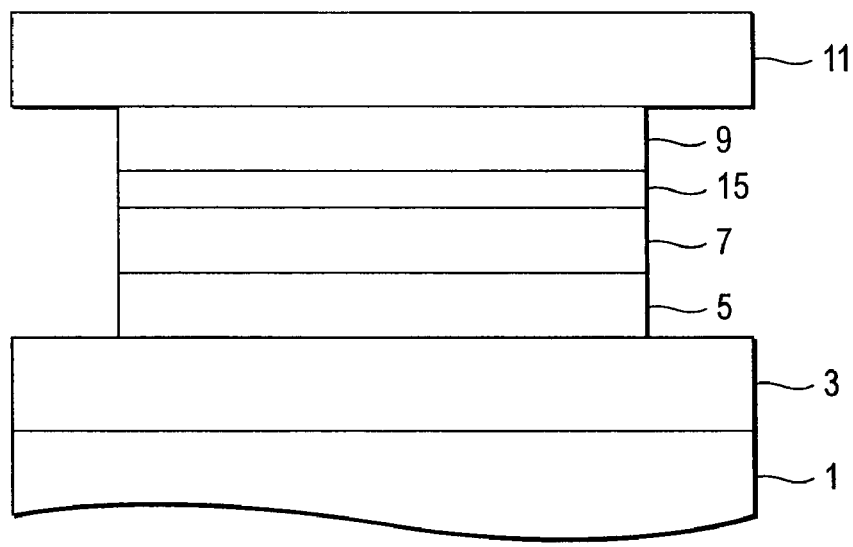
FIG. 13 is a sectional view to show a magnetic oscillation element according to a first example of the invention.

FIG. 13 is a sectional view of a magnetic oscillation element according to a first example according to the invention.

A stacked film was formed on a sapphire substrate 1 using sputter deposition and electron-beam lithography. The stacked film has a nonmagnetic layer 3 made of Ru, a ferromagnetic magnetization free layer 5 made of Co, a nonmagnetic layer 7 made of Cu, an NOL layer 15 formed by oxidizing the top face portion of the nonmagnetic layer 7, a ferromagnetic magnetization fixing layer 9 made of FePt, and a nonmagnetic layer 11 made of Cu in order from the side of a substrate 1.

As the thicknesses of the layers, the thickness of the Ru layer 3 was about 100 nm, the thickness of the Co layer 5 was about 0.6 nm, the thickness of the Cu layer 7 was about 10 nm, the thickness of the NOL layer 15 was about 1 to 2 nm, the thickness of the FePt layer 9 was about 30 nm, and the thickness of the Cu layer 11 was about 100 nm. Each joint area of the ferromagnetic layers Co layer 5 and FePt layer 9 and the nonmagnetic layer Cu layer 7 was about 100×200 nm$^2$.

The Co layer 5 and the FePt layer 9 are ferromagnetic layers with the magnetization direction being substantially perpendicular to the film surface and were formed under application of a magnetic field of about 8000 Oe in the perpendicular direction of the film so that the magnetization directions of the Co layer 5 and the FePt layer 9 became parallel. Oscillation spectrum measurement was conducted in a state in which an external magnetic field of 500 Oe was applied in the parallel direction to the magnetization directions of the Co layer 5 and the FePt layer 9 in the perpendicular direction to the film surface of the element and a 1.5 mA current was allowed to flow. The oscillatory frequency was 6.8 GHz and the spectrum width was 58 MHz.

Second Example

Figure 14:
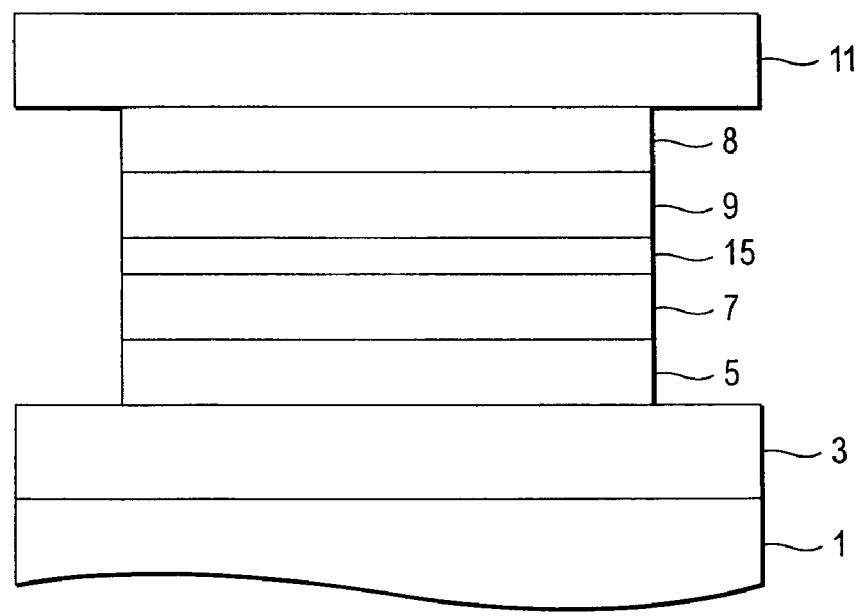
FIG. 14 is a sectional view to show a magnetic oscillation element according to a second example of the invention.

FIG. 14 is a sectional view of a magnetic oscillation element according to a second example according to the invention.

A stacked film was formed on a sapphire substrate 1 using sputter deposition and electron-beam lithography. The stacked film has a nonmagnetic layer 3 made of Ru, a ferromagnetic magnetization free layer 5 made of Co, a nonmagnetic layer 7 made of Cu, an NOL layer 15 formed by oxidizing the top face portion of the nonmagnetic layer 7, a ferromagnetic magnetization fixing layer 9 made of Co, an antiferromagnetic substance 8 made of IrMn, and a nonmagnetic layer 11 made of Cu in order from the side of a substrate 1.

As the thicknesses of the layers, the thickness of the Ru layer 3 was about 100 nm, the thickness of the Co layer 5 was about 1.2 nm, the thickness of the Cu layer 7 was about 10 nm, the thickness of the NOL layer 15 was about 1 to 2 nm, the thickness of the Co layer 9 was about 40 nm, the thickness of the IrMn layer 8 was about 50 nm, and the thickness of the Cu layer 11 was about 100 nm. Each joint area of the ferromagnetic layers Co layers 5 and 9 and the IrMn layer 8 and the nonmagnetic layer Cu layer 7 was about 100×200 nm$^2$.

The Co layer 5 and the Co layer 9 are ferromagnetic layers with the magnetization direction being substantially parallel to the film surface and the magnetization directions were made parallel. The demagnetizing field of the Co layer 5 of the magnetization free layer was $4\pi M - H_{K1} = 4\pi M_{eff} = 240$ Oe and the in-plane anisotropic magnetic field was 450 Oe. Element resistance R was 45Ω. Oscillation spectrum measurement was conducted in a state in which an external magnetic field of 500 Oe was applied in the easy axis of magnetization of the magnetization free layer Co layer 5 and magnetization fixing layer Co 9 and a 1.5 mA current was allowed to flow. The oscillatory frequency was 4.2 GHz and the spectrum width was 42 MHz.

Third Example

An example of using an artificial ferrimagnetic substance as a magnetization free layer will be discussed. In the description to follow, the value with the unit nm added in parentheses is the film thickness.

An element was manufactured according to a similar method to that in the second example using an artificial ferrimagnetic substance of Co (3.2 nm)/Ru (0.6 nm)/Co (2.6 nm) as a magnetization free layer and using an in-plane magnetization film of Co (40 nm) as a magnetization fixing layer and IrMn (50 nm) as an antiferromagnetic substance. Element resistance R was 65Ω. Oscillation spectrum measurement was conducted in a state in which an external magnetic field of 3000 Oe was applied in the easy axis of magnetization of the magnetization free layer and the magnetization fixing layer and a 1.5 mA current was allowed to flow. The oscillatory frequency was 8.4 GHz and the spectrum width was 47 MHz.

Fourth Example

An element with magnetization of a magnetization free layer made of an artificial ferrimagnetic substance pinned using IrMn (50 nm) in addition to the Co (40 nm) magnetization fixing layer in example 3 was manufactured according to a similar method to that in example 3. Element resistance R was 53Ω. Oscillation spectrum measurement was conducted in a state in which an external magnetic field of 500 Oe was applied in the direction of the exchange magnetic field of the magnetization free layer and the magnetization fixing layer and a 1.5 mA current was allowed to flow. The oscillatory frequency was 86 GHz and the spectrum width was 42 MHz.

Fifth Example

An element was manufactured according to a similar method to that in the second example using an artificial antiferromagnetic substance of Co (3.2 nm)/Ru (0.9 nm)/Co (3.2 nm) as a magnetization free layer and using an in-plane magnetization film of Co (40 nm) as a magnetization fixing layer and IrMn (50 nm) as an antiferromagnetic substance. The in-plane anisotropic magnetic field of the Co (3.2 nm) film was 5.8 KOe and the magnitude of the exchange magnetic field acting through Ru (0.9 nm) was 8.7 KOe. Oscillation spectrum measurement was conducted in a state in which an external magnetic field of 500 Oe was applied in the easy axis of magnetization of the magnetization free layer and the magnetization fixing layer and a 1.5 mA current was allowed to flow. The oscillatory frequency was 21 GHz and the spectrum width was 5.2 MHz.

Sixth Example

Figure 15:
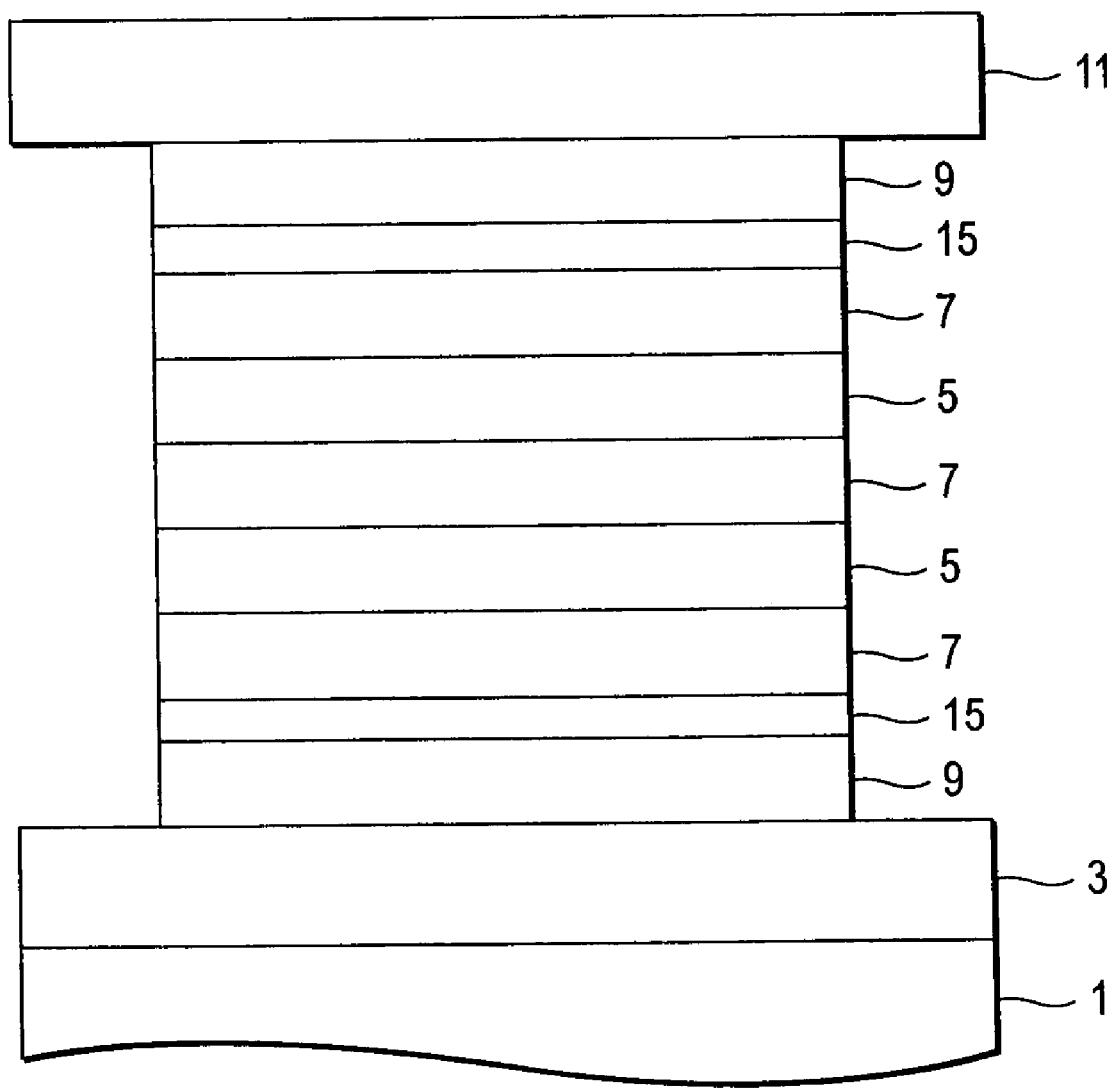
FIG. 15 is a sectional view to show a magnetic oscillation element according to a sixth example of the invention.

An element in FIG. 15 containing two Co (0.8 nm) free layers 5 and two FePt film (30 nm) magnetization fixing layers 9 which are the same as those in the first example was manufactured according to a similar method to that in the second example. Oscillation spectrum measurement was conducted in a state in which an external magnetic field of 500

Oe was applied in the easy axis of magnetization of the magnetization free layer and the magnetization fixing layer and a 1 mA current was allowed to flow. The oscillatory frequency was 6.4 GHz and the spectrum width was 56 MHz.

Fifth Embodiment

Figure 16:
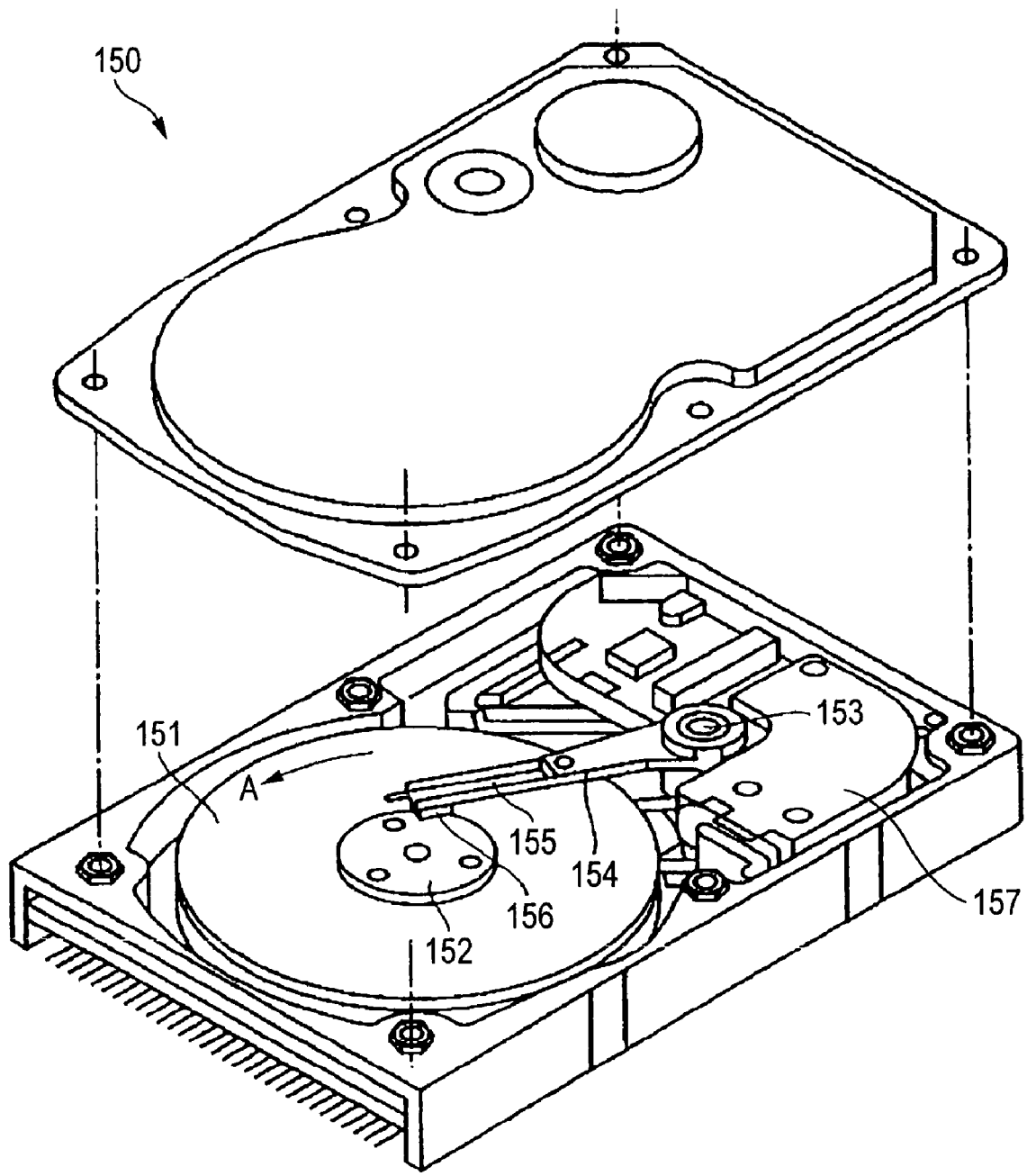
FIG. 16 is a perspective view of a magnetic recording and reproducing apparatus according to a fifth embodiment of the invention.

FIG. 16 is a perspective view of a magnetic recording and reproducing apparatus 150 according to a fifth embodiment of the invention. A magnetic disk (magnetic record medium) 151 is rotated in the arrow A direction by a spindle motor attached to a spindle 152. An actuator arm 154 is retained on a pivot 153. A suspension 155 is attached to the tip of the actuator arm 154. A head slider 156 is supported on the lower face of the suspension 155. A magnetic head containing a magnetic sensor previously described is mounted on the head slider 156. A voice coil motor 157 is formed in the base end part of the actuator arm 154.

When the magnetic disk 151 is rotated and the actuator arm 154 is pivoted by the voice coil motor 157 for loading the head slider 156 onto the magnetic disk 151, the medium opposed face (ABS) of the head slider 156 with the magnetic head mounted thereon is retained with a predetermined flotation amount from the surface of the magnetic disk 151. In this state, information recorded on the magnetic disk 151 can be read based on the principle as described above.

Although the embodiments and the examples of the invention have been described, it is to be understood that the invention is not limited to the above-described embodiments or examples and various changes may be made within the spirit and scope of the invention as claimed in claims.

It is also to be understood that the invention can be embodied in various modified forms without departing from the spirit and scope of the invention.

As described above, the magnetic oscillation elements of the embodiments and examples are characterized by the fact that the oscillation line width is narrow, and the magnetic oscillation elements high in the signal purity can be implemented.

What is claimed is:

1. A magnetic oscillation element comprising:
a magnetization fixing layer whose magnetization direction is substantially pinned toward one direction;
a nonmagnetic layer that is disposed on the magnetization fixing layer;
a magnetization free layer whose magnetization direction fluctuates, the magnetization free layer being disposed on the nonmagnetic layer; and
a pair of electrodes that applies a current in a direction perpendicular to the film surface of the magnetization fixing layer, the nonmagnetic layer, and the magnetization free layer,
wherein the magnetization free layer is excited with a magnetization vibration caused by spin transfer from the magnetization fixing layer due to the application of the current, and
wherein the magnetization free layer includes an artificial ferromagnetic or antiferromagnetic substance comprising a stacked film like ferromagnetic layer, nonmagnetic layer, and ferromagnetic layer.

2. The magnetic oscillation element according to claim 1, wherein the magnetization free layer and the magnetization fixing layer are perpendicular magnetization films.

3. The magnetic oscillation element according to claim 2, wherein the perpendicular magnetization film is configured as one of a Co film, a Co/nonmagnetic layer stacked film, a CoCr-based alloy film, a Co multilayer film, a CoCrPt-based alloy film, an FePt-based alloy film, an SmCo-based alloy film containing a rare-earth element, and a TbFeCo alloy film.

4. The magnetic oscillation element according to claim 1, wherein the magnetization fixing layer and the magnetization free layer are in-plane magnetization films.

5. The magnetic oscillation element according to claim 4, wherein the difference between a crystal anisotropy magnetic field and a shape anisotropy magnetic field of the magnetization free layer in the direction perpendicular to the film surface is configured to be 1 KOe or less.

6. The magnetic oscillation element according to claim 1, wherein the artificial ferrimagnetic substance is applied with an exchange bias from an antiferromagnetic substance.

7. The magnetic oscillation element according to claim 1, wherein the nonmagnetic layer is an insulating layer.

8. A magnetic sensor comprising the magnetic oscillation element according to claim 1.

9. A magnetoresistive head comprising the magnetic sensor according to claim 8.

10. A magnetic recording/reproducing apparatus comprising:
the magnetoresistive head according to claim 9; and
a magnetic recording medium.

11. A magnetic oscillation element comprising:
a multilayer film comprising:
a first magnetization fixing layer whose magnetization direction is substantially pinned toward one direction;
a first nonmagnetic layer that is disposed on the first magnetization fixing layer;
a first magnetization free layer whose magnetization direction fluctuates, the first magnetization free layer being disposed on the first nonmagnetic layer;
a second nonmagnetic layer that is disposed on the first magnetization free layer;
a second magnetization free layer whose magnetization direction fluctuates, the second magnetization free layer being disposed on the second nonmagnetic layer;
a third nonmagnetic layer that is disposed on the second magnetization free layer; and
a second magnetization fixing layer whose magnetization direction is pinned toward one direction, the second magnetization fixing layer being disposed on the third nonmagnetic layer; and
a pair of electrodes that applies a current in a direction perpendicular to the film surface of the multilayer film,
wherein the first and second magnetization free layers are excited with a magnetization vibration caused by spin transfer from the first and second magnetization fixing layers due to the application of the current, and
wherein at least one of the first and second magnetization free layers includes an artificial ferromagnetic or antiferromagnetic substance comprising a stacked film like ferromagnetic layer, nonmagnetic layer, and ferromagnetic layer.

12. The magnetic oscillation element according to claim 11, wherein the first and second magnetization free layers and the first and second magnetization fixing layers are perpendicular magnetization films.

13. The magnetic oscillation element according to claim 12, wherein the perpendicular magnetization film is configured as one of a Co film, a Co/nonmagnetic layer stacked film, a CoCr-based alloy film, a Co multilayer film, a CoCrPt-based alloy film, an FePt-based alloy film, an SmCo-based alloy film containing a rare-earth element, and a TbFeCo alloy film.

14. The magnetic oscillation element according to claim 11, wherein the first and second magnetization free layers and the first and second magnetization fixing layers are in-plane magnetization films.

15. The magnetic oscillation element according to claim 14, wherein the difference between a crystal anisotropy magnetic field and a shape anisotropy magnetic field of the first and second magnetization free layers in the direction perpendicular to the film surface is configured to be 1 KOe or less.

16. The magnetic oscillation element according to claim 11, wherein the artificial ferrimagnetic substance is applied with an exchange bias from an antiferromagnetic substance.

17. The magnetic oscillation element according to claim 11, wherein at least one of the first through third nonmagnetic layers is an insulating layer.

18. A magnetic sensor comprising the magnetic oscillation element according to claim 11.

19. A magnetoresistive head comprising the magnetic sensor according to claim 17.

20. A magnetic recording/reproducing apparatus comprising:
   the magnetoresistive head according to claim 18; and
   a magnetic recording medium.

* * * * *